(12) United States Patent
Loiko et al.

(10) Patent No.: US 9,111,867 B2
(45) Date of Patent: Aug. 18, 2015

(54) SPLIT GATE NANOCRYSTAL MEMORY INTEGRATION

(71) Applicant: Freescale Semiconductor, Inc., Austin, TX (US)

(72) Inventors: Konstantin V Loiko, Austin, TX (US); Brian A Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 14/015,006

(22) Filed: Aug. 30, 2013

(65) Prior Publication Data
US 2015/0060989 A1 Mar. 5, 2015

(51) Int. Cl.
  *H01L 21/28* (2006.01)
  *H01L 29/49* (2006.01)
  *H01L 29/423* (2006.01)
  *H01L 29/66* (2006.01)
  *H01L 27/115* (2006.01)
  *H01L 29/51* (2006.01)

(52) U.S. Cl.
  CPC .... *H01L 21/28282* (2013.01); *H01L 21/28273* (2013.01); *H01L 27/11546* (2013.01); *H01L 29/42332* (2013.01); *H01L 29/42344* (2013.01); *H01L 29/49* (2013.01); *H01L 29/6659* (2013.01); *H01L 29/66545* (2013.01); *H01L 29/66825* (2013.01); *H01L 29/517* (2013.01)

(58) Field of Classification Search
  CPC .................. H01L 21/28282; H01L 29/42344
  See application file for complete search history.

(56) References Cited

U.S. PATENT DOCUMENTS

| | | | |
|---|---|---|---|
| 7,932,146 B2 | 4/2011 | Chen et al. | |
| 2003/0235952 A1* | 12/2003 | Shibata | 438/257 |
| 2004/0132247 A1* | 7/2004 | Kasuya | 438/257 |
| 2006/0131642 A1* | 6/2006 | Iwata et al. | 257/324 |
| 2008/0164511 A1* | 7/2008 | Kim | 257/321 |
| 2010/0029052 A1 | 2/2010 | Kang et al. | |
| 2010/0078706 A1* | 4/2010 | Matsuda | 257/326 |
| 2010/0148242 A1* | 6/2010 | Satou | 257/326 |
| 2010/0315884 A1* | 12/2010 | Toh et al. | 365/185.29 |
| 2012/0175697 A1* | 7/2012 | Hall et al. | 257/325 |
| 2012/0228697 A1* | 9/2012 | Youm et al. | 257/329 |
| 2012/0322246 A1* | 12/2012 | Wang et al. | 438/488 |
| 2013/0017678 A1* | 1/2013 | Tsai et al. | 438/591 |
| 2013/0105912 A1* | 5/2013 | Hsu et al. | 257/379 |
| 2013/0181273 A1* | 7/2013 | Charpin-Nicolle | 257/314 |
| 2014/0159114 A1* | 6/2014 | Zheng et al. | 257/192 |
| 2014/0179076 A1* | 6/2014 | Shinohara | 438/275 |
| 2014/0225176 A1* | 8/2014 | Cheek et al. | 257/314 |
| 2014/0252445 A1* | 9/2014 | Chen et al. | 257/316 |
| 2015/0001610 A1* | 1/2015 | Zhang et al. | 257/324 |
| 2015/0054045 A1* | 2/2015 | Chakihara et al. | 257/314 |

* cited by examiner

*Primary Examiner* — Joseph C Nicely
(74) *Attorney, Agent, or Firm* — Terrile, Cannatti, Chambers & Holland, LLP; Michael Rocco Cannatti

(57) ABSTRACT

A process integration is disclosed for fabricating non-volatile memory (NVM) cells having spacer control gates (108) along with a high-k-metal-poly select gate (121, 123, 127) and one or more additional in-laid high-k metal CMOS transistor gates (121, 124, 128) using a gate-last HKMG CMOS process flow without interfering with the operation or reliability of the NVM cells.

14 Claims, 6 Drawing Sheets

SPLIT GATE NANOCRYSTAL MEMORY INTEGRATION

BACKGROUND OF THE INVENTION

1. Field of the Invention

The present invention is directed in general to integrated circuit devices and methods for manufacturing same. In one aspect, the present invention relates to the fabrication of CMOS metal gate devices and non-volatile memory devices integrated on a single substrate or chip.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. While the introduction of novel gate stack materials for forming high-k metal gate stacks using gate last processes has improved device performance and reduced feature sizes for transistor devices, there are a number of integration options and challenges associated with the integration of such novel materials with existing polysilicon nanocrystal thin film storage bitcells. For example, as the dimensions of transistors decrease, the height of the conventional gate stacks used to form NVM bitcells has been reduced to prevent the "gate last" processing steps from damaging the NVM bitcell gates.

BRIEF DESCRIPTION OF THE DRAWINGS

The present invention may be understood, and its numerous objects, features and advantages obtained, when the following detailed description is considered in conjunction with the following drawings, in which.

Figure 1:
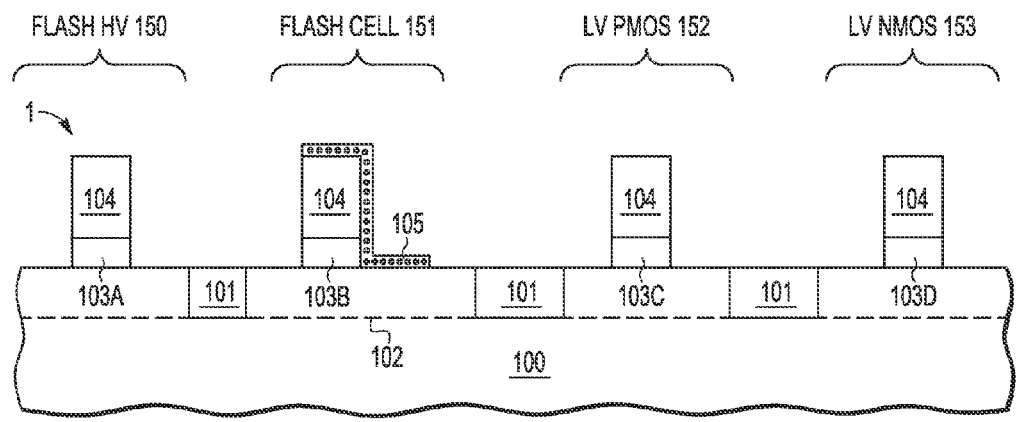
FIGS. 1-10 show a first example semiconductor device during successive phases of a fabrication sequence in which split-gate thin film storage non-volatile memory bitcells with spacer control gates are integrated with a gate-last process used to form NMOS and PMOS high-k metal gate transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A compact split-gate nanocrystal thin film storage (TFS) non-volatile memory (NVM) bitcell integrated with high-k metal gate (HKMG) transistors and associated fabrication process are disclosed in which the NVM bitcells are formed with a spacer control gate and an HKMG select gate that is formed along with non-NVM HKMG transistor gates using a CMOS gate-last fabrication sequence to enable the co-existence of embedded flash and HKMG transistors on the same wafer. In selected embodiments, the spacer control gates are formed on recessed substrate control gate channel regions to lower the top of the spacer control gate relative to the top of sacrificial select gates used to form the HKMG select gate. After patterning a poly layer with a first gate pattern to define one or more sacrificial poly select gates over an NVM area and one or more sacrificial poly transistor gates in the non-NVM area, a nanocrystal stack (or other charge storage layer) and spacer control gate are formed next to each sacrificial poly select gate in the NVM area, thereby forming one or more split-gate nanocrystal TFS NVM bitcells. By depositing and anisotropically etching a control gate layer formed over the poly select gates and nanocrystal stack, the resulting spacer control gate may be shorter than the sacrificial poly select gate(s) and sacrificial poly transistor gate(s). The relative height differential may be increased by forming the spacer control gate over recessed substrate control gate channel regions. Selected embodiments of the disclosed integration scheme fabricate the spacer control gate(s) by depositing a control gate polysilicon layer over previously-formed sacrificial poly select gate electrode(s) and adjacent nanocrystal stack layer, selectively etching the control gate polysilicon layer to leave a polysilicon sidewall layer portion over the intended control gate region(s), and then anisotropically etching the polysilicon sidewall layer portion to form the spacer control gate as a sidewall spacer adjacent to the nanocrystal stack, thereby forming TFS bitcells in an NVM area. Using a shared gate-last process sequence, the sacrificial poly select gate(s) and poly transistor gate(s) may be replaced with high-k metal gates having enhanced isolation between the high-k metal select gate and spacer control gate. In selected embodiments, the gate-last process sequence may include forming a planarized dielectric layer which exposes the top surfaces of the sacrificial poly select gate(s) and poly transistor gate(s), removing poly layers from the sacrificial poly select gates and sacrificial poly transistor gates to form gate electrode openings in the planarized dielectric layer that leave or expose a barrier metal layer formed over a high-k gate dielectric layer that was previously formed, and then forming one or more metal gate layers in the gate electrode openings which are then polished (e.g. with a chemical mechanical polish) to planarize the high-k metal gate electrodes and the planarized dielectric layer.

In this disclosure, an improved system, apparatus, and fabrication method are described for fabricating embedded non-volatile memory devices on-chip with CMOS metal-gate transistors using a gate-last process that address various problems in the art where various limitations and disadvantages of conventional solutions and technologies will become apparent to one of skill in the art after reviewing the remainder of the present application with reference to the drawings and detailed description provided herein. For example, there are challenges with combining non-volatile memory (such as flash EEPROM) into a standard CMOS process flow, especially as CMOS technology is increasingly replacing silicon dioxide gate dielectrics and polysilicon gate conductors with high dielectric constant (high-k) dielectrics in combination with metal gate electrodes formed with one or more metal layers to form high-k metal gate (HKMG) electrode stacks. With some existing HKMG fabrication processes, there are challenges with integrating a split-gate TFS bitcell into a gate last technology that is used to form the HKMG electrodes. For example, in a gate-last process where wafer planarization is applied to expose transistors formed using a sacrificial polysilicon gate to implement an inlaid or damascene method of forming HKMG gates, non-volatile memory designs which use a double-high gate stack in the split-gate NVM bitcell (e.g., due to overlap of the control gate on part of the select gate transistor) would be destroyed during the wafer planarization step. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a first example semiconductor device or structure 1 formed on a substrate 100 which includes patterned gate electrode stacks 103-104 formed in a flash high voltage area 150, flash memory cell area 151, low voltage PMOS transistor area 152, and low voltage NMOS transistor area 153, including a patterned select gate electrode 103B, 104 and nanocrystal stack layer 105 formed in the flash memory cell area 151. Stated more generally, the substrate 100 includes a non-volatile memory region 151 where flash memory cells are formed, and also includes one or more additional regions 150, 152-153 where processing circuitry, input/output circuits, logic devices, and the like are formed. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). As described below, one or more split-gate thin film storage non-volatile memory bitcells (e.g., flash high voltage transistors and/or flash memory cells) may be formed in the flash high voltage are 150 and/or flash memory cell area 151, such as by forming scaled TFS bitcells with spacer control gates and sacrificial in-laid poly select gates. Subsequently, a gate last process (a.k.a., a replacement gate method) is used to form high-k dielectric metal gate (HKMG) electrodes for the select gates and CMOS transistor gates.

In the semiconductor structure 1, the depicted substrate 100 may be formed as a bulk semiconductor substrate or other substrate in which one or more additional semiconductor layers and/or well regions are formed using epitaxial semiconductor growth and/or selective doping techniques as described more fully hereinbelow. For example, the substrate 100 may be a semiconductor-on-insulator (SOT) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 100 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other III/V or II/VI compound semiconductors or any combination thereof.

In an upper portion of the substrate 100, a plurality of shallow trench isolation (STI) structures 101 are formed that divide the substrate 100 into separate regions, such as a flash high voltage area 150, flash memory cell area 151, low voltage PMOS transistor area 152, and low voltage NMOS transistor area 153. Thus, the STI structures 101 define lateral boundaries of different regions 150-153, and may be formed using any desired technique, such as selectively etching an opening in the substrate 100 using a patterned mask or photoresist layer (not shown), depositing a dielectric layer (e.g., oxide) to fill the opening, and then polishing the deposited dielectric layer until planarized with the remaining substrate 100. Any remaining unetched portions of the patterned mask or photoresist layer(s) are stripped. As will be appreciated, the STI structures 101 may be formed in other ways in other embodiments.

In each of the defined regions 150-153, upper portions of substrate 100 include active substrate layers between the STI regions 101 that may be doped differently, depending on whether the transistors formed in each area are n-type or p-type devices. For example, the active substrate layers in the NMOS transistor region 153 may be implanted with impurities of a first conductivity type (e.g., p-type impurities, such as boron) to form a p-well region, where the masking, implantation energy, dosage, and profile for the p-well region are suitable for the formation of NMOS transistors. In addition, the active substrate layers in the PMOS transistor region 152 may be implanted with impurities of a second type (e.g., n-type impurities, such as arsenic or phosphorous) to form an n-well region, where the masking, implantation energy, dosage, and profile for the n-well region are suitable for the formation of NMOS transistor. In similar fashion, the upper portions of substrate 100 in the flash high voltage area 150 and/or flash memory cell area 151 may also include active substrate layers or well regions which will be doped differently, depending on whether the transistors formed in each area are n-type or p-type flash devices. And though not shown, there may also be one or more deep well regions of opposite polarity which are formed to isolate an upper active substrate layer. Thus, it will be appreciated that the polarity of the well regions formed in each region 150-153 will depend on the type of device (PMOS or NMOS) being formed.

In the flash memory cell area 151 of the semiconductor structure 1, one or more split-gate nanocrystal TFS NVM bitcell structures may be formed with one or more spacer control gates and an in-laid HKMG select gate using any desired processing steps. By way of providing a non-limiting example of processing steps that may be used, one or more gate dielectric layers 103A-D may be formed over the entirety of the substrate 100 and STI structures 101, such as by growing or depositing a base dielectric layer of silicon dioxide and/or other suitable gate dielectric layer(s) to a predetermined gate dielectric thickness, depending on the gate dielectric requirements of the devices formed in the different device regions 150-153. Though the gate dielectric layers 103A-D are shown as having the same thickness for purposes of simplicity, it will be appreciated that one or more of the gate dielectric layers 103A-D may have different thicknesses or constituent materials. For example, the gate dielectric layer(s) 103A formed in the flash high voltage area 150 may include one or more gate dielectric layers formed with selected materials to a first predetermined thickness, while the gate dielectric layer(s) 103C, 103D formed in the PMOS and NMOS transistor areas 152, 153 may include one or more different gate dielectric layers formed with selected materials to a second predetermined thickness. In the flash memory cell area 151, the gate dielectric layer 103B may include a base dielectric layer that is selectively formed over the flash cell array well region 102, such as by thermally growing an oxide layer and/or depositing an oxide with a low pressure chemical vapor deposition (LPCVD) high temperature oxide (HTO) to a predetermined thickness (e.g., approximately 5-50 Angstroms), though other materials or thicknesses may be used. In this setting, the selective formation of the base dielectric layer may involve forming a photoresist etch mask over the flash cell array well region 102 so that the base dielectric layer may be etched or otherwise removed from the CMOS well regions 152-153. After selectively forming the base dielectric layer over the flash cell array well region 102, a high-k dielectric layer may be formed to a predetermined gate dielectric thickness over the semiconductor structure 1, alone or in combination with a deposited barrier metal layer. In selected embodiments, the high-k dielectric layer may be formed by depositing a high-k gate dielectric material with a relatively high dielectric constant value on top of the base dielectric layer using chemical vapor deposition (CVD), plasma-enhanced chemical vapor deposition (PECVD), physical vapor deposition (PVD), atomic layer deposition (ALD), or any combination(s) of the above. In selected embodiments, the high-k dielectric layer may be formed by a low temperature CVD or ALD process to a predetermined final thickness in the range of 1-100 Angstroms (e.g., 15-25 Angstroms), though other thicknesses may be used. A suitable high-k gate dielectric material for the high-k dielectric layer is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. A suitable temperature for the deposition process is in the range of approximately 200 degrees Celsius to approximately 400 degrees Celsius.

On the gate dielectric layer(s) 103A-D, one of more gate conductor layers 104 may be formed, such as by blanket-depositing a layer of barrier metal to a thickness of approximately 50-200 Angstroms followed by a layer of polysilicon or SiGe over the gate dielectric layer(s) 103A-D using CVD, PECVD, PVD, ALD, or any combination(s) thereof to a thickness of approximately 500-2000 Angstroms, though thinner or thicker layers may also be used. The gate conductor layers 104 may be deposited as a doped poly layer, or may be subsequently doped with appropriate impurities to make the select gate layer 104 conductive. The conductive gate layer(s) 104 and underlying gate dielectric layers 103A-D may be patterned and anisotropically etched to form the patterned gate electrode stacks 103-104 in the different regions 150-153. As will be appreciated, any desired gate patterning and etch sequence may be used to form the patterned gate electrode stacks 103-104, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning. As part of the gate pattern etch sequence, the exposed select gate dielectric layer(s) may also be cleared from the surface of the substrate 100.

After stripping or removing any etch mask or photoresist layers from the patterned select gate electrode stacks 103-104, one or more counter-doped control gate channel regions (not shown) may be formed in the flash memory cell area 151 by implanting impurities around the select gate electrode stacks 103B, 104 and any implant masks using conventional implanting processes to implant ions having a predetermined conductivity type. For example, if the flash cell area 151 is intended for N channel operation, the implanted control gate channel region is counter-doped with arsenic, phosphorous or another appropriate n-type dopant by selectively masking off the remainder of the substrate 100 from implantation. Conversely, if the flash cell area 151 is intended for P channel operation, the implanted control gate channel region is lightly implanted with boron, indium or another appropriate p-type dopant by selectively masking off the remainder of the substrate 100 from implantation. If desired, offset spacers may be formed on the sidewalls of the select gate electrode stacks 103B, 104 prior to counter doping, such as by depositing one or more suitable dielectric layer(s) over the select gate electrode stacks 103B, 104 and then anisotropically etching the dielectric layer(s) to form the offset spacers.

After counter-doping the control gate channel regions, a charge storage layer 105 of discrete storage elements is selectively formed over the select gate electrode stacks 103B, 104, including at least a top and side surface of the patterned select gate electrode stacks 103B-104 and the intended control gate channel regions. In selected embodiments, the discrete storage elements are silicon nanocrystals. In other embodiments, the discrete storage elements may be made of other types of material such as, for example, polysilicon nanocrystals, silicon germanium nanocrystals, nanoclusters of a metal (e.g. gold, ruthenium, nickel, cobalt, tungsten), or nanoclusters of a silicide (e.g. cobalt silicide, nickel silicide). The discrete storage elements are used to selectively store charge introduced during a programming operation to selectively adjust a voltage threshold of a transistor depending upon whether a "1" or "0" value is to be stored in the memory cell. In selected embodiments, the charge storage layer 105 is formed as a nanocrystal stack, thereby forming a polysilicon-nitridedsilicon dioxide (poly-SiON) stack. While any desired charge storage layer sequence may be used, in selected example embodiments, the charge storage layer 105 may include an insulating layer formed over the substrate 100 and patterned select gate electrode stacks 103B-104, such as by depositing a high-k dielectric layer or other appropriate insulating layer to a predetermined thickness (e.g., approximately 40-150 Angstroms), though other thicknesses may be used. On the insulating layer, a layer of conductive nanocrystals may be formed, where the nanocrystals having predetermined diameters (e.g., approximately 3-10 nanometers) and spacing (e.g., about 5 nanometers apart). After depositing the nanocrystals, an insulating layer is formed over and around the nanocrystals, such as by depositing a suitable high-k dielectric with a low pressure chemical vapor deposition (LPCVD) to a predetermined thickness (e.g., approximately 100-200 Angstroms), though other materials or thicknesses may be used. The charge storage layer(s) 105 may then be patterned and etched using any desired selective etch sequence, such as by patterning a photoresist mask to protect the charge storage layer 105 formed on the side of the select gate electrode stacks 1031B, 104 and over the intended control gate channel regions (if not also the top of the select gate electrode stacks 103B, 104), and then selectively etching the exposed charge storage layer 105 with a dry etch, such as a reactive ion etch process.

Figure 2:
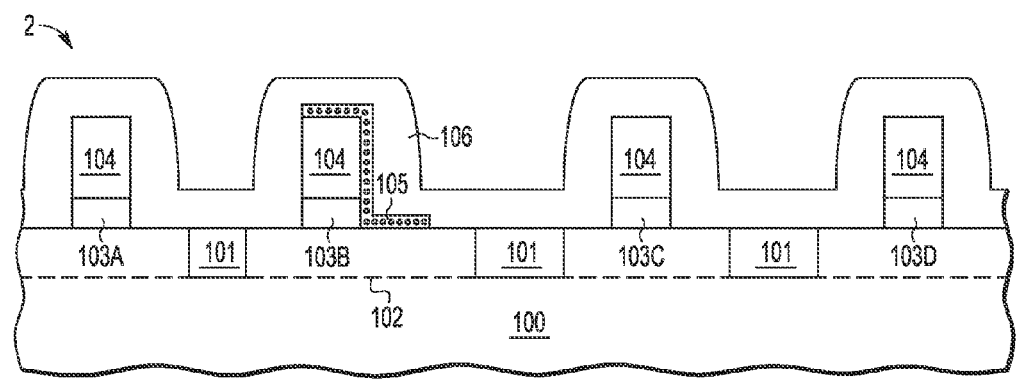

FIG. 2 illustrates processing of the semiconductor structure 2 subsequent to FIG. 1 after forming a control gate layer 106 to cover the patterned gate electrode stacks 103-104 and charge storage layer 105. As a preliminary step, a control gate barrier metal layer (not shown) may be deposited on the charge storage layer 105, such as by depositing titanium nitride using CVD, PECVD, PVD, ALD, or any combination(s) thereof to a predetermined thickness of approximately 50-150 Angstroms, though other materials or thicknesses may be used. Next, a control gate layer 106 may be formed to cover the control gate barrier metal layer, patterned gate electrode stacks 103-104, and charge storage layer 105, such as by blanket-depositing a conformal layer of polysilicon or SiGe using CVD, PECVD, PVD, ALD, or any combination(s) thereof to a thickness of approximately 500-2000 Angstroms, though a thinner or thicker layer may also be used. When forming the conformal polysilicon control gate layer 106, the thickness may be controlled so that the openings formed between the patterned gate electrode stacks 103-104 are not completely filled. The control gate layer 106 may be deposited as a doped poly layer, or may be subsequently doped with appropriate impurities to make the control gate layer 106 conductive.

Figure 3:
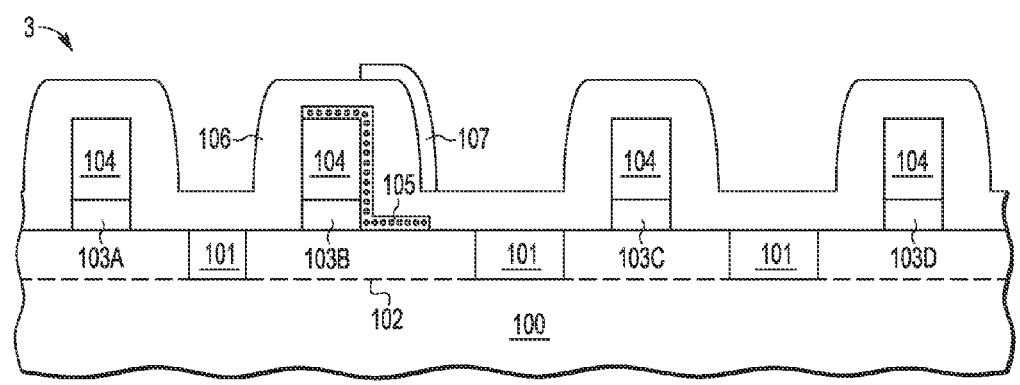

FIG. 3 illustrates processing of the semiconductor structure 3 subsequent to FIG. 2 after forming a patterned etch mask 107 is formed on the control gate layer 106 over the intended control gate region(s). For example, the patterned etch mask 107 may be formed with a patterned photoresist layer or other hard mask layer (e.g., silicon nitride) which is formed on the control gate layer 106 to protect the control gate layer 106 forming the intended control gate region(s) and to otherwise expose the control gate layer 106.

Figure 4:
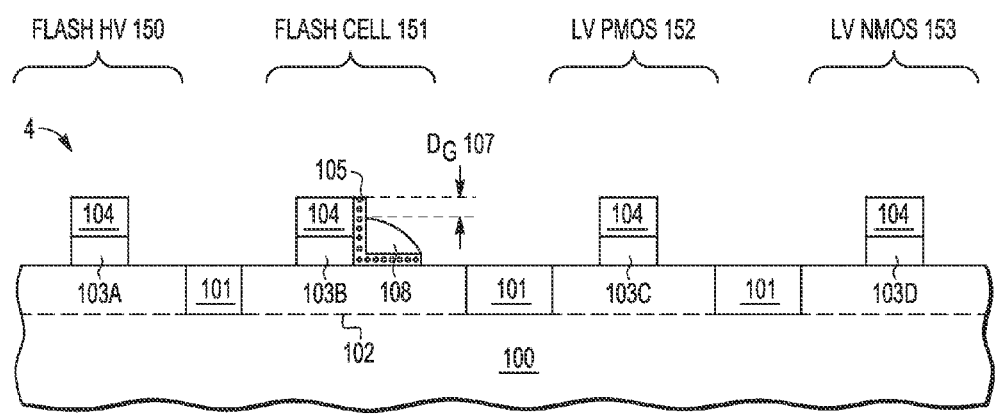

FIG. 4 illustrates processing of the semiconductor structure 4 subsequent to FIG. 3 after forming a spacer control gate layer 108 from the control gate poly layer 106. In selected embodiments, the spacer control gate layer 108 may be formed by applying one or more polish and/or etch processes in combination with the patterned etch mask 107 to form the spacer control gate layer 108. For example, by applying a dry etch process, such as a reactive ion etch process, with the patterned etch mask 107 in place, unmasked portions of the control gate poly layer 106 are removed to leave a polysilicon sidewall layer portion over the intended control gate regions. After stripping or removing the patterned etch mask 107, an anisotropic or directional etch may be applied to the polysilicon sidewall layer portion to form the spacer control gate 108 as a sidewall spacer adjacent to the charge storage layer 105. As formed, the spacer control gate 108 has a topmost surface that is shorter than (e.g., recessed below) the top of the patterned select gate electrode stack 103B, 104 by a minimum control gate recess distance ($D_G$) 107. At this point in the fabrication sequence, one or more split-gate electrodes 104, 105, 108 are formed in the flash memory cell area 151. In addition, the patterned gate conductor layers 104 in FIG. 4 are shown as having a reduced thickness as compared to FIG. 3 that may result from the applied polish and/or etch processes, but in other embodiments, the height of the patterned gate conductor layers 104 may not be reduced, or only slightly reduced.

Figure 5:
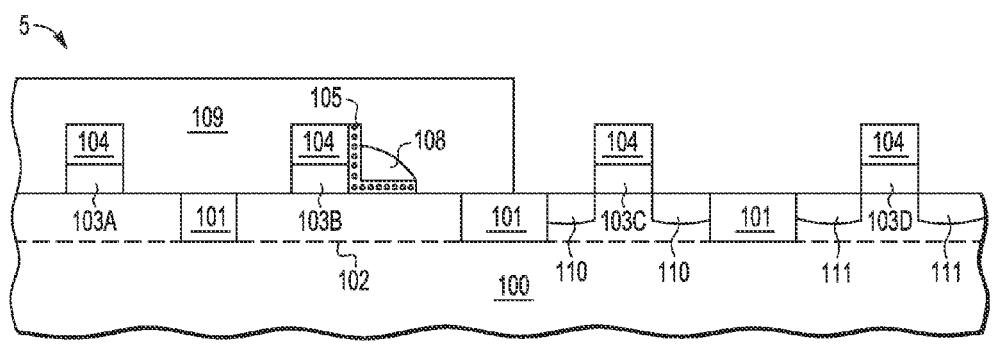

FIG. 5 illustrates processing of the semiconductor structure 5 subsequent to FIG. 4 after forming halo or extension regions 110-111 in the CMOS transistor regions 152-153. Before forming the halo/extension regions 110-111, a protective mask 109 may be formed over the flash regions 150-151 to cover and protect the split-gate electrodes 104, 105, 108 and any other flash transistor gates 103A, 104, such as by selectively forming a nitride or silicon oxide layer over the semiconductor structure 5 with an opening that exposes the CMOS transistor regions 152-153. With the protective mask 109 in place, any desired halo/extension implant sequence may be used to implant appropriate polarity dopants, such as n-type halo/extension regions for n-type transistor devices or p-type halo/extension regions for p-type transistor devices.

Figure 6:
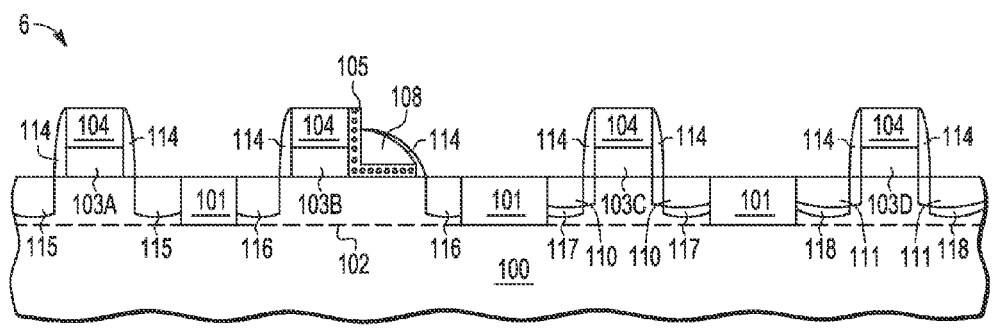

FIG. 6 illustrates processing of the semiconductor structure 6 subsequent to FIG. 5 after additional implant regions 115-118 and sidewall spacers 114 are formed around the patterned gate electrode stacks 103-104 in the flash and CMOS regions 150-153. Prior to forming source/drain regions, the protective mask 109 may be removed or stripped to expose the flash regions 150-151. With the patterned gate electrode stacks 103-104 exposed, one or more source/drain regions may be formed using any desired source/drain implant sequence. For example, the patterned gate electrode stacks 103-104 in combination with one or more patterned implant masks (not shown) may be used to form halo or extension regions (not shown) by implanting appropriate polarity dopants, such as n-type halo/extension regions for n-type flash cell devices or p-type halo/extension regions for p-type flash cell devices around the patterned gate electrode stacks 103-104 and into the substrate 100. In addition, a first set of sidewall spacers 114 may be formed on the patterned gate electrode stacks 103-104 (including the split-gate electrodes 104, 105, 108) as implant masks by forming one or more first dielectric layers (e.g., silicon dioxide or nitride) over the semiconductor structure 6 and anisotropically etching the one or more first dielectric layers on the patterned gate electrode stacks 103-104. Using the first set of sidewall spacers 114 and split-gate electrodes 104, 105, 108 in combination with one or more patterned implant masks (not shown), deep source/drain implant regions 116 may be formed as n-type source/drain regions for n-type flash cell devices or p-type source/drain regions for p-type flash cell devices by implanting appropriate polarity dopants in the flash memory cell area 151. In similar fashion, the sidewall spacers 114 and the patterned gate electrode stacks 103-104 may be used to form deep source/drain implant regions 115, 117-118 in the transistors in the flash high voltage area 150, low voltage PMOS transistor area 152, and low voltage NMOS transistor area 153 by implanting appropriate polarity dopants, such as n-type or p-type source/drain regions 115, 117, 118 for transistors in these areas, depending on the polarity of the transistors.

At this point in the fabrication sequence, the patterned gate electrode stacks 103-104 are formed as sacrificial gate electrodes, one or more of which may include a high-k gate dielectric layer in HK-first embodiments where the high-k dielectric gate layer is formed as part of the patterned gate electrode stack. Though not shown, silicided regions may be formed on one or more of the source/drain regions 115-118, if not also the patterned gate conductor layers 104, such as by forming self-aligned silicide regions by depositing and thermally annealing conductive or metal layer (e.g., cobalt or nickel) to react with the exposed semiconductor layers to form the silicide regions.

Figure 7:
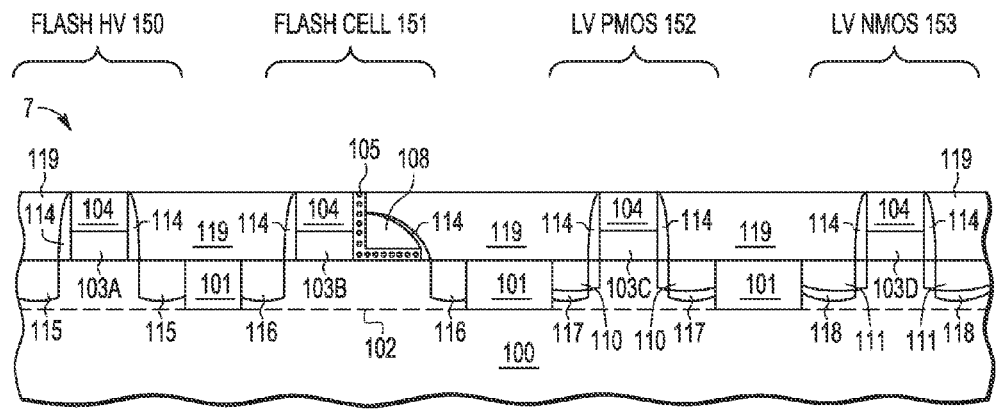

FIG. 7 illustrates processing of the semiconductor structure 7 subsequent to FIG. 6 after a planarized dielectric layer 119 is formed over the flash and CMOS regions 150-153 to expose at least a portion of the patterned gate conductor layers 104 in each region. In selected embodiments, the planarized dielectric layer 119 may be formed by depositing one or more planarized dielectric layers 119 over the semiconductor structure 7 to cover the flash and CMOS regions 150-153. As part of a first interlayer dielectric stack, the planarized dielectric layer(s) 119 may be formed by depositing a dielectric layer using CVD, PECVD, PVD, or ALD to a predetermined thickness (e.g., approximately 500-5000 Angstroms) that is at least as thick as the height of the patterned gate electrode stacks 103-104. As deposited, the dielectric layer 119 can be formed alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LPTEOS) CVD layer(s), plasma-enhanced TEOS (PETEOS) layer(s), and/or $SiO_xN_y$, atmospheric pressure TEOS (APTEOS) layer(s), HDP BPTEOS or HDP plasma enhanced PTEOS layer(s). In addition, the deposited dielectric layer 119 can be planarized using any desired planarization process, such as a timed chemical mechanical polish step, to form a substantially planar surface on the planarized dielectric layer 119 that exposes the top of the patterned gate conductor layers 104 without reaching or exposing the recessed spacer control gate layer 108. As will be appreciated, the planarized dielectric layers 119 may be densified with one or more anneal process steps, though it will be appreciated that an anneal process may also be applied subsequently in the fabrication process.

Figure 8:
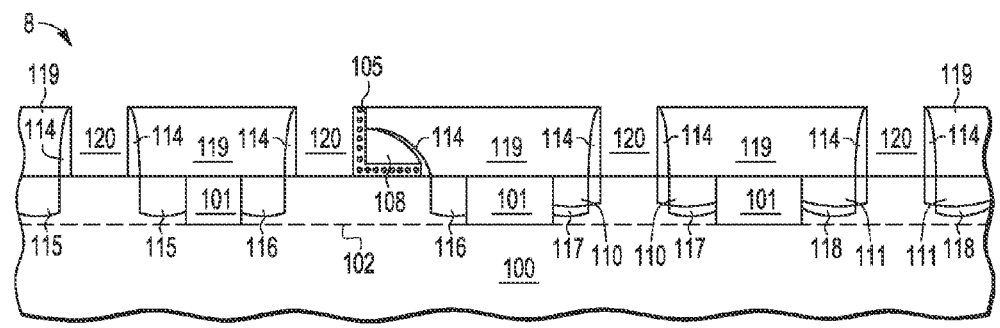

FIG. 8 illustrates processing of the semiconductor structure 8 subsequent to FIG. 7 after at least a portion of the sacrificial gate electrodes are removed to form gate electrode openings 120 in the flash and CMOS regions 150-153 by applying one or more etch processes. For example, a first poly etch process is applied to remove the exposed poly layers from the patterned gate conductor layers 104, where the poly etch process is selective to the material (e.g., oxide) used to form the planarized dielectric layer 119, charge storage layer 105, and the spacers 114. The removal of the exposed portions of the patterned poly layers may use any desired poly etch process, including a dry etching process such as reactive-ion etching, ion beam etching, plasma etching or laser etching, a wet etching process wherein a chemical etchant is employed or any combination thereof. Once the exposed portions of the patterned poly layers are removed, the resulting electrode openings 120 in the planarized dielectric layer 119 expose the previously formed gate dielectric layers 103 which may be covered with a suitable barrier metal layer (not shown). At this juncture, the gate dielectric layers 103 may be removed, such as by applying an appropriate dielectric etch chemistry. For example, one or more dielectric etch processes may be applied to remove the patterned gate dielectric layer 103 and expose the underlying substrate 101. Again, any desired dielectric etch process may be used, including a dry etching process such as reactive-ion etching, ion beam etching, plasma etching or laser etching, a wet etching process wherein a chemical etchant is employed or any combination thereof. In selected embodiments, a wet etch chemistry is applied briefly to remove the gate dielectric layer 103, where the timing and chemistry of the wet etch is controlled to minimize any etching of the planarized dielectric layer(s) 119, charge storage layer 105, or spacers 114.

Figure 9:
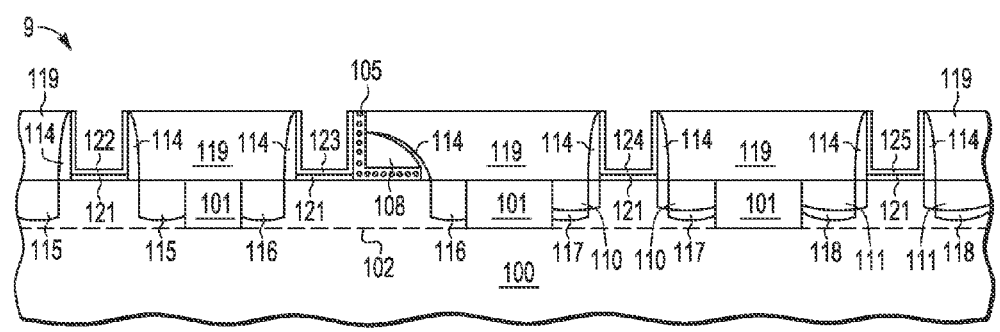

FIG. 9 illustrates processing of the semiconductor structure 9 subsequent to FIG. 8 after a replacement gate method is used to begin forming metal gate electrodes by forming dielectric layers 121 and metal interface layers 122-125 in the gate electrode openings 120. In the event that the gate dielectric layer 103 was removed from the gate electrode openings 120, one or more appropriate gate dielectric layers would be formed in the openings 120, such as by depositing or thermally growing an base oxide layer on at least the bottom of the electrode openings 120, followed by deposition of an appropriate high-k gate dielectric layer to cover the base oxide layer. Subsequently, the metal gate electrodes may be formed with any desired technique, such as by conformally depositing one or more metal interface layers 122-125 on the bottom of the gate electrode openings 120, depending on the type of transistor (e.g., NMOS or PMOS) being formed. As will be appreciated, the metal interface layer(s) 122-125 may be used to adjust the work function of the finally formed transistor, depending on its polarity type. In selected embodiments, the metal interface layer 124 is selectively formed as an PFET work function metal layer on an underlyling barrier metal layer (not shown) and high-k gate dielectric layer 121 in at least the gate electrode opening 120 used to form transistor devices in the PMOS transistor area 152, while the metal interface layer 125 is selectively formed as a NFET work function metal layer on the barrier metal layer 120 in at least the gate electrode opening 120 used to form transistor devices in the NMOS transistor area 153. In similar fashion, appropriate metal interface layers 122, 124 may be formed in the gate electrode openings 120 of the flash regions 150-151. This sequence can be implemented by depositing a first PFET metal interface layer in all exposed gate electrode openings 120 and over the planarized dielectric layer 119, followed by removing the first PFET metal interface layer from the NFET regions (e.g., with a patterned mask and etch process) and then depositing a second NFET metal interface layer in all exposed gate electrode openings 120. If desired, additional metal interface layers can be used, or alternatively, a single metal interface layer may be formed over PMOS and NMOS gate electrode openings 120. In addition, the metal interface layers 122-125 may be deposited using any desired deposition or sputtering process, such as CVD, PECVD, PVD, ALD, molecular beam deposition (MBD) or any combination(s) thereof. A suitable material for use as the metal interface layers 122-125 is an element or alloy (e.g., TaC or W) which may be deposited to a predetermined thickness of 20-150 Angstroms (e.g., 50-100 Angstroms), though other metallic layer materials with different thicknesses may be used. In selected embodiments, the metal interface layers 122-125 may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as $IrO_2$). If desired, the metal interface layer(s) may be removed from the top of the planarized dielectric layer 119 by applying a chemical mechanical polish to clear the top of the layer 119, though this polish step can occur later in the fabrication sequence.

Figure 10:
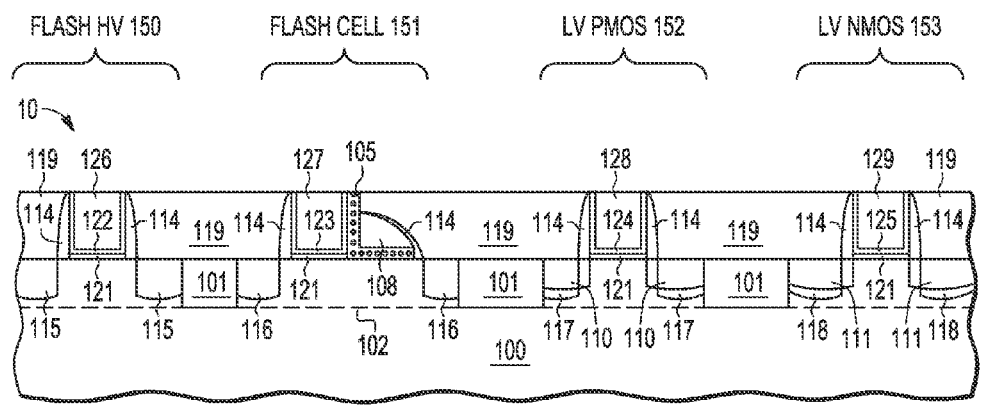

FIG. 10 illustrates processing of the semiconductor structure 10 subsequent to FIG. 9 after the gate electrode openings are filled with one or more metal gate layers 126-129 that are formed on the metal interface layer(s) 122-125. In selected embodiments, the metal gate layers 126-129 are formed with a conductive material, such as a metal or transition metal material including, as an example, aluminum, tungsten, titanium or TiN, using metal organic chemical vapor deposition (MOCVD), CVD, PECVD, PVD, ALD, MBD, or any combination(s) thereof to a predetermined thickness in the range of 200-1000 Angstroms (e.g., 500-600 Angstroms), though other materials and thicknesses may be used. Instead of the metal gate layer, a doped silicon-containing gate layer 126-129 may be disposed over the metal interface layer(s) 112-125 in other embodiments to form a metal gate stack. In selected embodiments, the silicon-containing layer 126-129 is an amorphous or polysilicon cap layer or an amorphous/poly silicon germanium cap layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. Silicon-containing gate layer 126-129 may also be a doped or undoped amorphous silicon or silicon germanium layer. However formed, the deposited metal interface and gate layers 122-129 may then be planarized with one or more planarization steps to complete an inlaid or damascene fabrication sequence for forming the HKMG select gate and transistor gate electrodes in the flash and CMOS regions 150-153. While any desired planarization process may be used, in accordance with various embodiments, the semiconductor structure 10 may be planarized with one or more polish and/or etch processes, such as using a chemical mechanical polish step to planarize the upper portions of the planarized dielectric layer 119 and high-k metal gate electrode structures.

As will be appreciated, additional processing steps may be used to complete the fabrication of the split-gate nonvolatile memory cells and other transistors in the flash and CMOS regions. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 12:
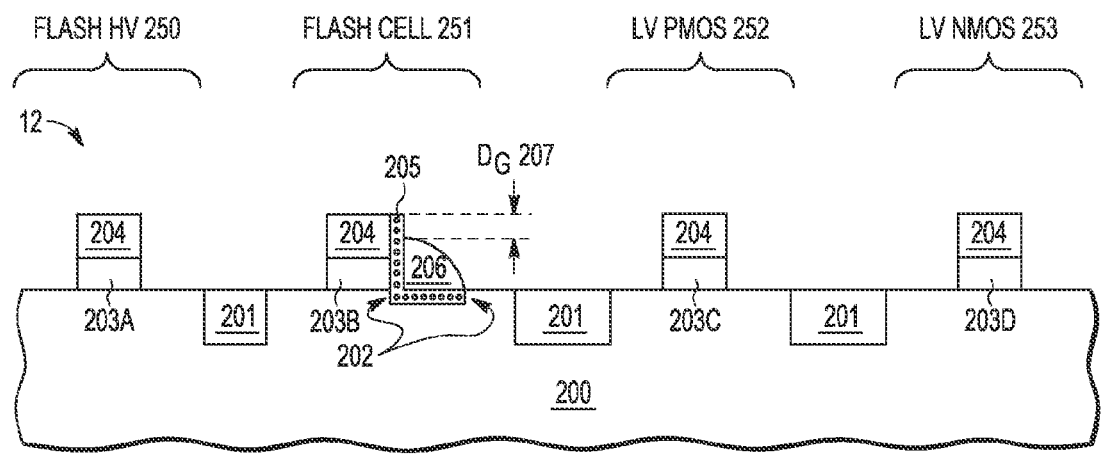
Figure 13:
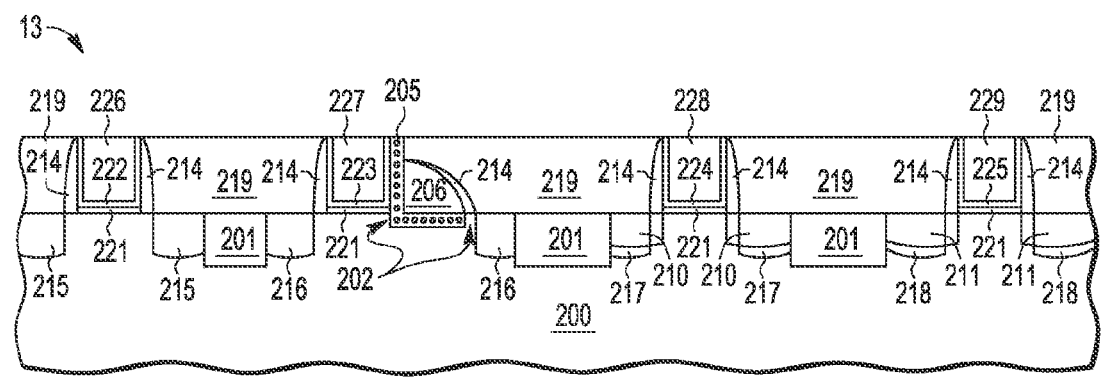

As seen from above, split-gate nanocrystal thin film storage (TFS) non-volatile memory (NVM) bitcells are integrated with high-k metal gate (HKMG) transistors on a wafer or substrate surface by forming spacer control gates on the same wafer/substrate surface level as the remainder of the HKMG transistors. However, it will be appreciated that various benefits of the present disclosure may also be obtained from forming the spacer control gates on a recessed or etched wafer/substrate surface so that the spacer control gate is protected during formation of the HKMG transistors. In addition, it will be appreciated that other types of split-gate NVM bitcell devices may be formed with different sequencing and/or materials. For example, FIGS. 11-13 show a second example semiconductor device during successive phases of a fabrication sequence in which split-gate TFS NVM bitcells with spacer control gates are fabricated on recessed substrate control gate channel regions are integrated with a gate-last process used to form NMOS and PMOS high-k metal gate transistors.

Figure 11:
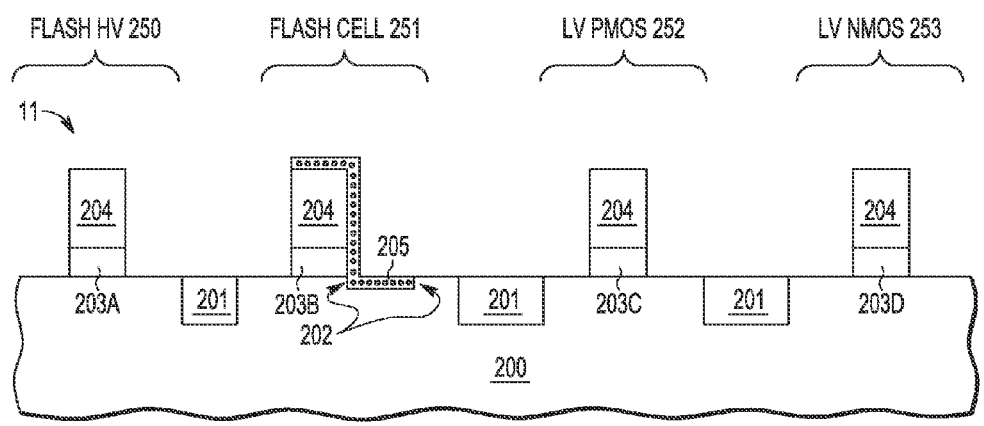
FIGS. 11-13 show a second example semiconductor device during successive phases of a fabrication sequence in which split-gate thin film storage non-volatile memory bitcells with spacer control gates formed on recessed substrate control gate channel regions are integrated with a gate-last process used to form NMOS and PMOS high-k metal gate transistors.

Starting with FIG. 11, there is shown a partial cross-sectional view of the second semiconductor device or structure 11 formed on a substrate 200 which includes patterned gate electrode stacks 203-204 formed in a flash high voltage area 250, flash memory cell area 251, low voltage PMOS transistor area 252, and low voltage NMOS transistor area 253, including a patterned select gate electrode 203B, 204 and nanocrystal stack layer 205 formed in the flash memory cell area 251. The depicted substrate 200 may be formed as a bulk semiconductor substrate formed with any semiconductor material (e.g., Si, SiC, SiGe, SiGeC, Ge, GaAs, InAs, InP, as well as other III/V or II/VI compound semiconductors or any combination thereof), a semiconductor-on-insulator (SOI) type substrate, or any desired substrate structure in which one or more semiconductor layers and/or well regions are formed. In an upper portion of the substrate 200, shallow trench isolation (STI) structures 201 are formed using any desire technique to divide the substrate 200 into separate isolated regions 250-253. Though not shown, the upper well regions of the substrate 200 may include active substrate layers which are selectively doped, depending on whether the bitcells formed in the area are n-type or p-type devices.

In the flash memory cell area 251 of the semiconductor structure 11, one or more split-gate polysilicon nanocrystal TFS NVM bitcell structures may be formed with one or more poly gate layers using any desired processing steps. By way of providing a non-limiting example of processing steps that may be used, FIG. 11 shows that one or more patterned select gate electrodes 203-204 may be fabricated, followed by a recess etch of the exposed silicon surface where the control gate transistors will be fabricated. In an example fabrication sequence, the patterned select gate electrodes 203-204 may be formed by first growing or depositing one or more gate dielectric layers 203A-D (e.g., silicon dioxide or other suitable gate dielectric layer) over the entirety of the substrate 200 and STI structures 201 to a predetermined gate dielectric thickness, depending on the gate dielectric requirements of the devices formed in the different device regions 250-253. Though shown as having the same thickness for purposes of simplicity, it will be appreciated that one or more of the gate dielectric layers 203A-D may have different thicknesses or constituent materials. For example, the gate dielectric layer 203B in the memory cell area 251 may include a high-k dielectric layer formed to a predetermined gate dielectric thickness, alone or in combination with a deposited barrier metal layer. After forming the gate dielectric layers 203A-D, one of more gate conductor layers 204 (e.g., a doped poly layer) is formed using CVD, PECVD, PVD, ALD, or other suitable formation process to define the gate electrode stack 203-204 which is then patterned and anisotropically etched to form the patterned gate electrode stacks 203-204. In at least the flash memory cell area 251, the gate etch process may include a substrate recess etch process (e.g., reactive ion etch process) that is controlled to over-etch into the array substrate region 200, thereby forming etched recess openings 202 over the intended control gate channel areas.

After forming the patterned gate electrodes 203-204 and recessed control gate channel areas 202 and otherwise preparing the semiconductor structure 11 (e.g., with a surface repair oxidation step), one or more counter-doped control gate channel regions (not shown) may be formed in the substrate 200 in the bottom of the etched recess openings 202 by implanting impurities around the select gate electrode stacks 203-204 and any implant masks using conventional implanting processes to implant ions having a predetermined conductivity type, depending on the device type being formed. In addition or in the alternative, a nanocrystal stack 205 may be formed over the semiconductor structure 11 using any desired nanocrystal stack formation sequence, such as by depositing one or more insulating layers in which silicon nanocrystals having predetermined diameters and spacing are formed, thereby forming a polysilicon-nitrided-silicon dioxide (poly-SiON) stack 203-205 in the flash memory cell area 251. In other embodiments, other charge storage layers may be formed. The nanocrystal stack 205 may be formed as a conformal layer to cover the recessed control gate channel areas 202 and the top and sides of the patterned gate electrode stacks 203, 204 in the flash and CMOS transistor regions 250-253. The charge storage layer(s) 205 may then be patterned and etched using any desired selective etch sequence, such as by patterning a photoresist mask (not shown) to protect the charge storage layer 205 formed on the side of the select gate electrode stacks 203B, 204 and over the intended control gate channel regions (if not also the top of the select gate electrode stacks 203B, 204), and then selectively etching the exposed charge storage layer 205 with a dry etch, such as a reactive ion etch process. In the example shown in FIG. 11, the resulting charge storage layer 205 is formed on at least the sidewall of the select gate electrode stack 203B, 204 and in the etched recess opening 202 over the intended control gate channel areas.

FIG. 12 illustrates processing of the semiconductor structure 12 subsequent to FIG. 11 after forming one or more spacer control gates 206 on the recessed substrate control gate channel region 202 to lower the top of the spacer control gate(s) 206 relative to the top of sacrificial select gate electrode stacks 203B. 204. As a preliminary step, a control gate barrier metal layer (not shown) may be deposited on at least the patterned charge storage layer 205, such as by depositing titanium nitride using CVD, PECVD, PVD, ALD, or any combination(s) thereof to a predetermined thickness of approximately 50-150 Angstroms, though other materials or thicknesses may be used. Next, a control gate layer may be formed to cover the control gate barrier metal layer, patterned select gate electrode stack 203B, 204, and charge storage layer 205, such as by blanket-depositing a conformal layer of polysilicon or SiGe using CVD, PECVD, PVD, ALD, or any combination(s) thereof to a thickness of approximately 500-2000 Angstroms, though a thinner or thicker layer may also be used. When forming the conformal polysilicon control gate layer, the thickness may be controlled so that the openings formed between the patterned gate electrode stacks 103-104 are not completely filled. After forming a patterned photoresist layer or other hard etch mask (not shown) on the control gate layer 106 to protect the control gate layer forming the intended control gate region(s) and to otherwise expose the control gate layer, one or more polish and/or etch processes may be applied to form the spacer control gate layer 206. For example, by applying a dry etch process, such as a reactive ion etch process, unmasked portions of the control gate poly layer are removed to leave a polysilicon sidewall layer portion over the intended control gate regions. After stripping or removing the patterned etch mask, an anisotropic or directional etch may be applied to the polysilicon sidewall layer portion to form the spacer control gate 206 as a sidewall spacer adjacent to the charge storage layer 205. By virtue of being formed over the etched recess opening 202, the spacer control gate 206 has a topmost surface that is shorter than (e.g., recessed below) the top of the patterned select gate electrode stack 203B, 204 by a minimum control gate recess distance ($D_G$) 207. At this point in the fabrication sequence, one or more split-gate electrodes 204, 205, 206 are formed in the flash memory cell area 251 along with patterned gate electrode stacks 203-204 formed in a flash high voltage area 250, low voltage PMOS transistor area 252, and low voltage NMOS transistor area 253. While the patterned gate conductor layers 204 in FIG. 12 are shown as having a reduced thickness as compared to FIG. 11 that may result from the applied polish and/or etch processes, it will be appreciated that, in other embodiments, the height of the patterned gate conductor layers 204 may not be reduced, or only slightly reduced.

FIG. 13 illustrates processing of the semiconductor structure 13 subsequent to FIG. 12 after forming transistor and flash memory cell devices in the flash and CMOS regions 250-253 with one or more high-k metal gate electrodes using a replacement gate process. While any desired fabrication sequence may be used, in an example processing sequence, the transistor and flash memory cell devices may be fabricated by first implanting source/drain regions 215-218 in the substrate 200, alone or in combination with halo or extension regions. Either before or after implanting the halo/extension/source/drain regions 215-218, one or more sidewall spacers 214 may be formed on the patterned gate electrode stacks 203-204 (including the split-gate electrodes 204, 205, 206) for use as implant masks by depositing and anisotropically etching one or more dielectric layers (e.g., silicon dioxide or nitride). Using the sidewall spacers 214 and patterned gate electrode stacks in combination with one or more patterned implant masks (not shown), deep source/drain implant regions 215-218 may be selectively formed in each of the flash and CMOS regions 250-253 by implanting appropriate polarity dopants, depending on the polarity and design of the transistors in each region 250-253. Serving as sacrificial gate electrodes, the patterned gate electrode stacks 203-204 and split-gate electrodes 204, 205, 206 are then covered with one or more planarized dielectric layers 219 which expose at least an upper portion or surface of the patterned gate conductor layers 204 in each region 250-253 without exposing the spacer control gates 206. Using one or more etch processes, all or part of the patterned gate electrode stacks 203-204 may be removed from the planarized dielectric layers 219 to define one or more gate electrode openings in the flash and CMOS regions 250-253 to either expose the underlying high-k gate dielectric layer or portions of the underlying substrate 200. In the gate electrode openings, the replacement gate process then forms metal gate electrodes by sequentially forming or depositing one or more gate dielectric layers 221 and metal interface and/or barrier layers 222-225 to line the bottom and sides of the gate electrode openings. In addition, one or more metal gate layers 226-229 are formed on the metal interface/barrier layer(s) 222-225 with a conductive material, such as a metal or transition metal material using MOCVD, CVD, PECVD, PVD, ALD, MBD, or any combination(s) thereof to a predetermined thickness. The deposited metal interface/barrier layers and metal gate layers 222-229 may then be planarized with one or more planarization steps (e.g., CMP) to complete an inlaid or damascene fabrication sequence for forming the HKMG select gate and transistor gate electrodes in the flash and CMOS regions 250-253.

Figure 14:
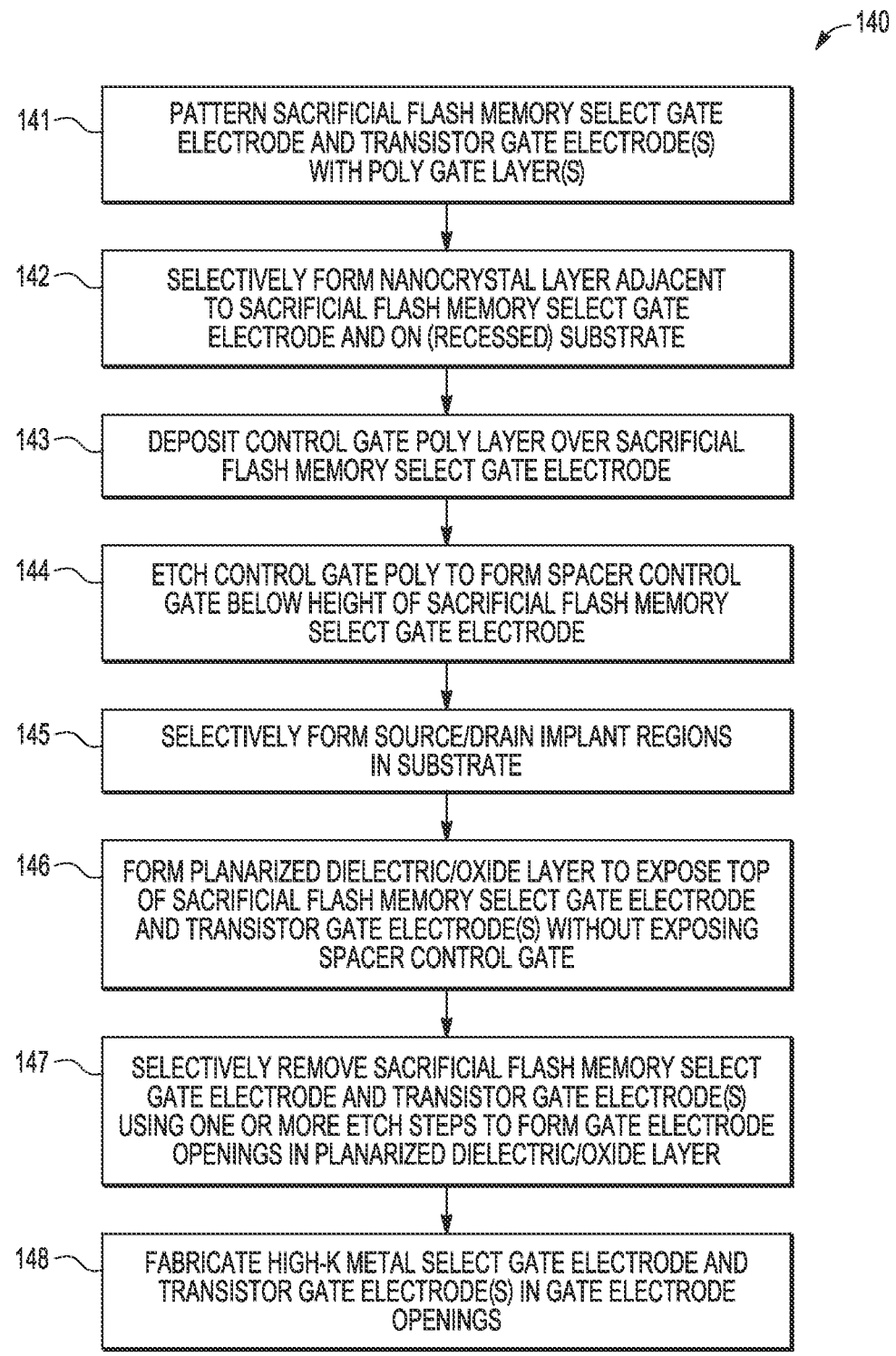
FIG. 14 illustrates an example process flow diagram of a fabrication sequence for integrating split-gate NVM memory cells having spacer poly control gates and in-laid high-k metal select gates formed with a replacement gate sequence for fabricating gate last high-k metal gate electrodes.

Turning now to FIG. 14, there is shown an example process flow diagram of a fabrication sequence 140 for integrating split-gate NVM memory cells having spacer control gates and in-laid high-k metal select gates formed with a replacement gate sequence for fabricating gate last high-k metal gate electrodes. As shown, the process begins at step 141 during the front end of line (FEOL) process for forming split-gate flash memory cells with one or more gate electrodes fabricated using a combination of metal, polysilicon, high-k dielectric layers. During the FEOL process, one or more sacrificial non-volatile memory (NVM) cell select gate electrodes and non-NVM transistor gate electrodes are fabricated by patterning and etching a gate electrode stack formed over one or more NVM and non-NVM areas. For example, sacrificial poly gate electrodes (including a sacrificial flash memory select gate electrode) may be formed by patterning a gate stack which includes a poly layer and a barrier metal layer formed over a high-k gate dielectric layer.

At step 142, a nanocrystal stack layer or other charge storage layer is selectively formed adjacent to the sacrificial flash/NVM select gate electrode to cover at least a first sidewall of the sacrificial select gate electrode and an adjacent control channel region of the substrate. In selected embodiments, the adjacent control channel region is formed in an unetched substrate surface, while in other embodiments, the adjacent control channel region is formed in a recessed or etched substrate surface which is formed as part of, or after, the pattern and etch process used to form the sacrificial select gate electrode. In selectively forming the nanocrystal stack layer, a first insulating layer may be formed over the substrate (e.g., by depositing a high-k dielectric layer or other appropriate insulating layer), on which a layer of conductive nanocrystals and second insulating layer are sequentially formed and then patterned with a selective etch process to form the nanocrystal stack layer on the side of the sacrificial select gate electrode and over the control gate channel region (or recessed channel gate channel region).

At step 143, a control gate layer may be formed or deposited over at least the sacrificial flash memory select gate electrode. For example, a control gate polysilicon layer may be deposited over the substrate using CVD, PECVD, PVD, ALD, or any combination(s) thereof to cover the nanocrystal stack layer which was previously formed on at least the side of the sacrificial select gate electrode and the (recessed) control gate channel region. In selected embodiments, a conformal polysilicon control gate layer is formed to have a controlled thickness so that any openings formed between patterned sacrificial gate electrodes are not completely filled.

At step 144, the control gate layer is etched to form a spacer control gate have a top surface or height which is below the top surface or height of the adjacent sacrificial flash memory select gate electrode. For example, portions of the control gate layer may be removed from the substrate except for the side of the sacrificial select gate electrode and over the control gate channel region, such as by applying a dry etch process with a patterned etch mask. The remaining portions of the control gate layer may then be anisotropically etched to form the spacer control gate on the sidewall of the nanocrystal stack layer on the sidewall of the sacrificial select gate electrode. As formed, the spacer control gate has a topmost surface that is shorter than (e.g., recessed below) the top of the sacrificial select gate electrode by a predetermined control gate recess distance ($D_G$). If the spacer control gate is formed over a recessed channel gate channel region, then the control gate recess distance may be larger than if formed on an unetched control gate channel. In any event, the spacer control gate and adjacent nanocrystal stack layer and sacrificial select gate electrode form a split-gate NVM electrode in which the spacer control gate has a reduced height or thickness as compared to the sacrificial select gate electrode.

At step 145, source/drain implant regions are selectively formed in the substrate. For example, source and drain regions may be defined both the NVM and non-NVM areas of substrate by implanting appropriate source/drain impurities around the sacrificial poly gate electrodes and split-gate NVM electrode, alone or in combination with one or more sidewall spacers and/or implant masks. In an example sequence, one or more sidewall spacers are formed on the sacrificial poly gate electrodes and spacer control gate electrodes and are used to implant source/drain regions in the exposed substrate areas.

At step 146, a planarized dielectric layer is formed over the sacrificial poly gate electrodes and split-gate NVM electrode to expose the top or sacrificial gate electrodes without exposing the spacer control gate. For example, the planarized dielectric layer may be formed by first depositing a layer or film of silicon oxide or other interlayer dielectric stack layer(s) to cover the sacrificial poly gate electrodes and split-gate NVM electrode. By polishing the deposited oxide/interlayer dielectric stack to a flat or planarized surface at a predetermined height or thickness, the resulting planarized dielectric/oxide layer covers and protects the spacer control gate in the NVM area, but exposes the sacrificial select gate electrode in the NVM area and the sacrificial transistor gate electrodes in the non-NVM area.

At step 147, the sacrificial select gate electrodes in the NVM area and sacrificial transistor gate electrodes in the non-NVM area are selectively removed using one or more etch steps to form gate electrode openings in the planarized dielectric/oxide layer. For example, one or more poly etch steps may be applied to remove the upper poly layer in the sacrificial select gate electrodes and sacrificial transistor gate electrodes. In addition, one or more additional oxide etch steps may also be applied to remove one or both of the underlying barrier metal layer and gate dielectric layer in the gate electrode openings.

At step 148, high-k metal gate (HKMG) electrodes are formed in the gate electrode openings in the planarized dielectric layer using a replacement gate method, thereby forming in-laid HKMG select gate electrodes and HKMG transistor gate electrodes in the gate electrode openings. While different materials and processes may be used to form the constituent layers for HKMG electrodes, the HKMG select and transistor gate electrodes may be formed by depositing and planarizing at least a first metal interface layer and metal-based gate electrode layer in the gate electrode openings. If required, one or more gate dielectric layers may be formed in the gate electrode openings prior to forming the first metal interface layer and metal-based gate electrode layer, such as be depositing or forming a high-k gate dielectric layer and barrier metal layer in the gate electrode openings. Subsequently, additional back end of line (BEOL) processing may be performed to deposit one or more additional interlayer dielectric layers and metal interconnect structures to make electrical contact with contacts formed at the split-gate nonvolatile memory cells and NMOS/PMOS transistors.

As seen from above, the fabrication sequence 140 is described with reference to sacrificial select gate electrodes and transistor gate electrodes that are exposed by a planarized dielectric layer which isolates previously-formed spacer control gate electrodes from the metal gate processing effects (e.g., metallic contamination) used in a gate last process flow to form high-k metal replacement gate electrodes in place of the sacrificial select gate electrodes and transistor gate electrodes, thereby defining TFS bitcells in the NVM area with an in-laid HKMG select gate and recessed HK-metal-poly control gate. However, it will be appreciated that various benefits of the present disclosure may also be obtained from forming the spacer control gate electrodes on a recessed control gate channels by performing a substrate recess etch when patterning the sacrificial select gate electrodes, or by otherwise elevating the top of the sacrificial select gate electrodes with respect to the top of the spacer control gate electrodes. In addition, it will be appreciated that other types of split-gate NVM bitcell devices may be formed with different sequencing and/or materials. And though selected embodiments are described for using a split-gate NVM cell with a storage layer containing conductive nanoclusters, any desired NVM cell structures may also be used, provided that the spacer control gate electrodes are protected during formation of the replacement select gates and CMOS transistor gates. Examples of alternative NVM cells include a split-gate cell utilizing a nitride storage layer, and a one-transistor NVM cell utilizing nitride storage (also known as a SONOS NVM cell), and the like.

By now it should be appreciated that there is provided herein a semiconductor fabrication process for embedding non-volatile memory devices in an HKMG CMOS process. In the disclosed process, sacrificial gate structures are formed over a wafer, including a sacrificial select gate structure formed over a non-volatile memory cell area of the wafer and one more sacrificial gate structures formed over the wafer outside of the non-volatile memory cell area. In selected embodiments, the sacrificial gate structures may be formed by forming one or more gate dielectric layers on the wafer, and then forming a polysilicon layer on the one or more gate dielectric layers to cover the wafer, where the polysilicon layer and gate dielectric layer(s) may be selectively etched to form a plurality of patterned sacrificial gate structures on the wafer. In other embodiments, the sacrificial gate structures may be formed by sequentially forming one or more high-k dielectric layers, barrier metal layers, and polysilicon layers over the wafer which are then patterned and etched to form the sacrificial gate structures. On a first sidewall of the sacrificial select gate structure, a charge storage layer is formed to extend over an adjacent control channel region. Prior to forming the charge storage layer, a recess may be selectively etched into the substrate and adjacent to the first sidewall of the sacrificial select gate structure, thereby forming the adjacent control channel having a recessed surface which is below a top surface of the wafer. In addition, a spacer control gate is formed adjacent to the charge storage layer on the first sidewall of the sacrificial select gate structure so that the spacer control gate is shorter than the sacrificial gate structures. In selected embodiments, the spacer control gate may be formed by selectively forming a polysilicon sidewall layer on the charge storage layer formed on the first sidewall of the sacrificial select gate structure, and then anisotropically etching the polysilicon sidewall layer to form the spacer control gate having an upper surface which is recessed below an upper surface of the sacrificial select gate structure. To form the polysilicon sidewall layer, a polysilicon layer may be deposited on the charge storage layer to cover at least top and side surfaces of the sacrificial select gate structure and the adjacent control channel region. Using the etch mask to protect a first portion of the polysilicon layer extending from the first sidewall of the sacrificial select gate structure to the adjacent control channel region, the polysilicon layer may be patterned and etched to remove the polysilicon layer except for the first portion of the polysilicon layer. Subsequently, a planarized dielectric layer is formed over the wafer to protect at least the spacer control gate and to expose at least an upper surface of the sacrificial gate structures. In selected embodiments, the planarized dielectric layer may be formed by depositing an oxide layer over the wafer to cover the sacrificial gate structures, and then planarizing the oxide layer with a chemical mechanical polish process to form a substantially flat upper surface to protect at least the spacer control gate and to expose at least the upper surface of the sacrificial gate structures. After selectively removing at least part of the sacrificial gate structures from the planarized dielectric layer without removing the spacer control gate, a plurality of gate electrode openings are formed which include a select gate electrode opening where the sacrificial select gate structure was formed. In the gate electrode openings, a plurality of high-k metal gate electrodes are formed while protecting the spacer control gate with the planarized dielectric layer, thereby forming a split-gate structure over the non-volatile memory cell area comprising the spacer control gate adjacent to the charge storage layer and a high-k metal select gate electrode formed in the select gate electrode opening. In selected embodiments, the high-k metal gate electrodes may be formed by depositing one or more metal-based layers in the plurality of gate electrode openings, and then polishing the one or more metal-based layers down to be substantially coplanar with the planarized dielectric layer to define the plurality of high-k metal gate electrodes, each having an upper surface which is elevated above the upper surface of the spacer control gate. In other embodiments, the high-k metal gate electrodes may be formed by depositing a first metal interface layer in the plurality of gate electrode openings to cover an underlying high-k dielectric layer, and then depositing one or more metal gate electrode layers in the plurality of gate electrode openings to cover the first metal interface layer. Subsequently, one or more polish and/or etch steps may be applied to form a plurality of planarized high-k metal-gate electrodes that are substantially coplanar with the planarized dielectric layer.

In another form, there is disclosed a semiconductor device and associated method of forming same. In the disclosed methodology and device, there is provided a wafer having a first region and a second region for non-volatile memory cells. On the wafer, sacrificial transistor gate electrodes are formed over the first and second regions, including at least a sacrificial select gate electrode formed over the second region. In selected embodiments, the sacrificial transistor gate electrodes are formed by forming (e.g., depositing) a first high-k gate dielectric layer on the wafer in the first and second region, and then forming (e.g., depositing) a first polysilicon layer over the first high-k gate dielectric layer in the first and second regions, where the first polysilicon layer and first high-k gate dielectric layer may be patterned to define the sacrificial transistor gate electrodes. In other embodiments, the sacrificial transistor gate electrodes are formed by forming (e.g., depositing) one or more high-k dielectric layers over the wafer using a dielectric material which has a dielectric constant value of 7.0 or greater; depositing one or more barrier metal layers on the one or more high-k dielectric layers; depositing one or more polysilicon layers over the one or more barrier metal layers; and patterning and etching the one or more polysilicon layers, barrier metal layers, and high-k dielectric layers to form the sacrificial transistor gate electrodes. After forming the sacrificial select gate electrodes, the wafer may be selectively recessed adjacent to the sacrificial select gate electrode to form a recessed control channel having a recessed surface which is below a top surface of the wafer. In addition, a charge storage layer having a plurality of discrete storage elements is formed on a first sidewall of the sacrificial select gate electrode to extend over an adjacent control channel region. Subsequently, a spacer control gate electrode is formed adjacent to the charge storage layer to cover the adjacent control channel, where the spacer control gate electrode has an upper surface that is below an upper surface of the sacrificial select gate electrode. In selected embodiments, the spacer control gate electrode is formed as a polysilicon spacer control gate electrode by anisotropically etching a polysilicon layer deposited on the charge storage layer so that the polysilicon spacer control gate electrode has an upper surface that is below an upper surface of the sacrificial select gate electrode. In other embodiments, the spacer control gate electrode is formed by depositing a polysilicon layer to cover the charge storage layer formed on the first sidewall of the sacrificial select gate electrode to extend over the adjacent control channel region, and then patterning the polysilicon layer with an etch mask to protect a first portion of the polysilicon layer extending from the first sidewall of the sacrificial select gate layer to the adjacent control channel region, where the etch mask is used to etch the polysilicon layer to remove the polysilicon layer except for the first portion of the polysilicon layer, after which the first portion of the polysilicon layer may be anisotropically etched to form the spacer control gate. In addition, one or more source/drain regions are formed in the second region of the wafer that are adjacent to the sacrificial select gate electrode and the spacer control gate electrode. Subsequently, metal gates are formed by replacing the sacrificial select gate electrode with a metal select gate electrode in the second region while replacing the sacrificial transistor gate electrodes with corresponding metal gate electrodes in the first region using a replacement gate process. In selected embodiments, the metal gates are formed by first forming a planarized dielectric layer to expose an upper surface of the sacrificial transistor gate electrodes while protecting the spacer control gate electrode, and then selectively removing at least part of the sacrificial transistor gate electrodes to form gate electrode openings in the planarized dielectric layer so that a high-k metal gate electrode may be formed in each gate electrode opening. In other embodiments, the metal gates are formed by forming one or more metal-based layers in the gate electrode openings formed in the planarized dielectric layer, and then polishing the one or more metal-based layers down to be substantially coplanar with the planarized dielectric layer to define a plurality of high-k metal gate electrodes, each having an upper surface which is elevated above the upper surface of the spacer control gate electrode. For example, the planarized dielectric layer may be formed by depositing an oxide layer over the wafer to cover the sacrificial transistor gate electrodes, and then planarizing the oxide layer with a chemical mechanical polish process to form a substantially flat upper surface to protect at least the spacer control gate electrode and to expose at least the upper surface of the sacrificial transistor gate electrodes. In this way, a non-volatile memory cell is formed in the second region which includes the metal select gate electrode, charge storage layer, and spacer control gate.

In yet another form, there is provided a semiconductor device with integrated transistors and non-volatile memory cells and associated method for fabricating same. As disclosed, the semiconductor device includes a semiconductor substrate which has a circuit region and a non-volatile memory region. The semiconductor device also includes one or more non-volatile discrete storage element bitcells formed in the non-volatile memory region, each including a high-k metal select gate electrode, a discrete storage element storage layer located on a first sidewall of the high-k metal select gate electrode and extending over an adjacent control channel region of the semiconductor substrate, and a spacer control gate electrode formed adjacent to the nanocrystal stack layer to cover the adjacent control channel region and having an upper surface which is recessed below an upper surface of the high-k metal select gate electrode. The semiconductor device also includes one or more high-k metal gate transistors formed in the logic region using a replacement gate process. In selected embodiments, the adjacent control channel region is formed as a recessed substrate control gate channel region of the semiconductor substrate adjacent to the first sidewall of the high-k metal select gate electrode, where the recessed substrate control gate channel region has a bottom surface which is recessed below a main surface of the wafer.

Although the described exemplary embodiments disclosed herein are directed to various semiconductor device structures and methods for making same using an integrated HKMG process to form recessed spacer control gates and in-laid high-k metal select gates formed with a replacement gate sequence for fabricating gate last high-k metal gate electrodes, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various poly gate electrode devices are illustrated as being split-gate flash memory devices, this is merely for convenience of explanation and not intended to be limiting and persons of skill in the art will understand that the principles taught herein apply to devices of either conductivity type. Accordingly, other types of poly gate devices may be formed on-chip with metal-gate electrodes as disclosed herein. Moreover, the thicknesses and doping concentrations of the described layers may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled." as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising." or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
   forming a plurality of sacrificial gate structures over a wafer, comprising a sacrificial select gate structure formed over a non-volatile memory cell area of the wafer and one or more sacrificial gate structures formed over the wafer outside of the non-volatile memory cell area;

forming a charge storage layer on a first sidewall of the sacrificial select gate structure to extend over an adjacent control channel region;

depositing a polysilicon layer on the charge storage layer to cover at least top and side surfaces of the sacrificial select gate structure and the adjacent control channel region;

forming a patterned etch mask on the polysilicon layer to protect a first portion of the polysilicon layer extending from the first sidewall of the sacrificial select gate structure to the adjacent control channel region;

etching the polysilicon layer with the patterned etch mask in place to remove the polysilicon layer except for the first portion of the polysilicon layer;

removing the patterned etch mask;

anisotropically etching the first portion of the polysilicon layer to form a spacer control gate adjacent to the charge storage layer formed on the first sidewall of the sacrificial select gate structure, where the spacer control gate has an upper surface which is recessed below an upper surface of the sacrificial select gate structure;

forming a planarized dielectric layer over the wafer which protects at least the spacer control gate and which exposes at least an upper surface of the plurality of sacrificial gate structures;

selectively removing at least part of the plurality of sacrificial gate structures to form a plurality of gate electrode openings in the planarized dielectric layer without removing the spacer control gate, where the plurality of gate electrode openings comprises a select gate electrode opening where the sacrificial select gate structure was formed; and forming a plurality of high-k metal gate electrodes in the gate electrode openings while protecting the spacer control gate with the planarized dielectric layer, thereby forming a split-gate structure over the non-volatile memory cell area comprising the spacer control gate adjacent to the charge storage layer and a high-k metal select gate electrode formed in the select gate electrode opening.

2. The semiconductor fabrication process of claim 1, where forming the plurality of sacrificial gate structures comprises:
   forming one or more gate dielectric layers on the wafer;
   forming a polysilicon layer on the one or more gate dielectric layers to cover the wafer; and
   selectively etching the polysilicon layer and one or more gate dielectric layers to form a plurality of patterned sacrificial gate structures on the wafer.

3. The semiconductor fabrication process of claim 1, where forming the plurality of sacrificial gate structures comprises:
   forming one or more high-k dielectric layers over the wafer using a dielectric material which has a dielectric constant value of 7.0 or greater;
   depositing one or more barrier metal layers over the one or more high-k dielectric layers;
   depositing one or more polysilicon layers over the one or more barrier metal layers; and
   patterning and etching the one or more polysilicon layers, barrier metal layers, and high-k dielectric layers to form the plurality of sacrificial gate structures.

4. The semiconductor fabrication process of claim 1, further comprising selectively etching a recess into the substrate and adjacent to the first sidewall of the sacrificial select gate structure prior to forming the charge storage layer, thereby forming a recessed surface which is below a top surface of the wafer.

5. The semiconductor fabrication process of claim 1, where forming the planarized dielectric layer comprises:
   depositing an oxide layer over the wafer to cover the plurality of sacrificial gate structures; and
   planarizing the oxide layer with a chemical mechanical polish process to form a substantially flat upper surface to protect at least the spacer control gate and to expose at least the upper surface of the plurality of sacrificial gate structures.

6. The semiconductor fabrication process of claim 1, where forming the plurality of high-k metal gate electrodes comprises:
   forming one or more metal-based layers in the plurality of gate electrode openings; and
   polishing the one or more metal-based layers down to be substantially coplanar with the planarized dielectric layer to define the plurality of high-k metal gate electrodes, each having an upper surface which is elevated above the upper surface of the spacer control gate.

7. The semiconductor fabrication process of claim 1, where forming the plurality of high-k metal gate electrodes comprises:
   depositing a first metal interface layer in the plurality of gate electrode openings to cover an underlying high-k dielectric layer;
   depositing one or more metal gate electrode layers in the plurality of gate electrode openings to cover the first metal interface layer; and
   applying one or more polish and/or etch steps to form a plurality of planarized high-k metal-gate electrodes that are substantially coplanar with the planarized dielectric layer.

8. A method for forming a semiconductor device comprising:
   providing a wafer comprising a first region and a second region for non-volatile memory cells;
   forming a plurality of sacrificial transistor gate electrodes over the first and second regions, comprising a sacrificial select gate electrode over the second region;
   forming a charge storage layer comprising a plurality of discrete storage elements on a first sidewall of the sacrificial select gate electrode to extend over an adjacent control channel region;
   depositing a polysilicon layer to cover the charge storage layer formed on the first sidewall of the sacrificial select gate electrode to extend over the adjacent control channel region;
   forming a patterned etch mask on the polysilicon layer to protect a first portion of the polysilicon layer extending from the first sidewall of the sacrificial select gate layer to the adjacent control channel region while leaving exposed a second portion of the polysilicon layer extending from a second, opposite sidewall of the sacrificial select gate layer;
   etching the polysilicon layer with the patterned etch mask in place to remove the second portion of the polysilicon layer and leave the first portion of the polysilicon layer in place;
   removing the patterned etch mask; then
   anisotropically etching the first portion of the polysilicon layer to form a spacer control gate adjacent to the charge storage layer to cover the adjacent control channel, where the spacer control gate electrode has an upper surface that is below an upper surface of the sacrificial select gate electrode;

forming one or more source/drain regions in the second region of the wafer that are adjacent to the sacrificial select gate electrode and the spacer control gate electrode; and forming a plurality of metal gates by replacing the sacrificial select gate electrode with a metal select gate electrode in the second region while replacing the plurality of sacrificial transistor gate electrodes with a corresponding plurality of metal gate electrodes in the first region using a replacement gate process, thereby forming a non-volatile memory cell in the second region comprising the metal select gate electrode, charge storage layer, and spacer control gate.

9. The method of claim 8, where forming the plurality of sacrificial transistor gate electrodes comprises:

forming a first high-k gate dielectric layer on the wafer in the first and second regions;

forming a first polysilicon layer over the first high-k gate dielectric layer in the first and second regions; and patterning the first polysilicon layer and first high-k gate dielectric layer to define the plurality of sacrificial transistor gate electrodes.

10. The method of claim 8, where forming the plurality of sacrificial transistor gate electrodes comprises:

forming one or more high-k dielectric layers over the wafer using a dielectric material which has a dielectric constant value of 7.0 or greater;

depositing one or more barrier metal layers on the one or more high-k dielectric layers;

depositing one or more polysilicon layers over the one or more barrier metal layers; and patterning and etching the one or more polysilicon layers, barrier metal layers, and high-k dielectric layers to form the plurality of sacrificial transistor gate electrodes.

11. The method of claim 8, further comprising selectively recessing the wafer adjacent to the sacrificial select gate electrode to form a recessed surface which is below a top surface of the wafer.

12. The method of claim 8, where forming the plurality of metal gates comprises:

forming a planarized dielectric layer which exposes an upper surface of the plurality of sacrificial transistor gate electrodes while protecting the spacer control gate electrode;

selectively removing at least part of the plurality of sacrificial transistor gate electrodes to form gate electrode openings in the planarized dielectric layer; and forming a high-k metal gate electrode in each gate electrode opening.

13. The method of claim 12, where forming the plurality of metal gates comprises:

forming one or more metal-based layers in the gate electrode openings formed in the planarized dielectric layer; and polishing the one or more metal-based layers down to be substantially coplanar with the planarized dielectric layer to define a plurality of high-k metal gate electrodes, each having an upper surface which is elevated above the upper surface of the spacer control gate electrode.

14. The method of claim 12, where forming a planarized dielectric layer comprises:

depositing an oxide layer over the wafer to cover the plurality of sacrificial transistor gate electrodes, and planarizing the oxide layer with a chemical mechanical polish process to form a substantially flat upper surface to protect at least the spacer control gate electrode and to expose at least the upper surface of the plurality of sacrificial transistor gate electrodes.

* * * * *